United States Patent [19]

Jourjine

[11] Patent Number: 4,996,648
[45] Date of Patent: Feb. 26, 1991

[54] NEURAL NETWORK USING RANDOM BINARY CODE

[76] Inventor: Alexander N. Jourjine, P.O. Box 425, Cambridge, Mass. 02142

[21] Appl. No.: 113,636

[22] Filed: Oct. 27, 1987

[51] Int. Cl.$^5$ .................. G11C 27/00; G06F 13/00; H03K 19/08
[52] U.S. Cl. .................. 364/513; 364/900; 364/972.4; 307/201; 365/45; 365/49
[58] Field of Search .................. 365/45, 49, 167; 364/800, 513; 307/201

[56] References Cited

U.S. PATENT DOCUMENTS

| | | | |
|---|---|---|---|
| 3,979,582 | 9/1976 | Mims | 364/807 |
| 4,747,069 | 3/1988 | Grinberg | 364/807 |
| 4,809,193 | 2/1989 | Jourjine | 364/513 |

OTHER PUBLICATIONS

Electronic Engineering Times Feb. 12, 1990, "Digital Neurons Mimic Analog", by Colin Johnson.
EDN Magazine Article-"Data Transformation Explains the Basis of Neural Networks", by D. Conner 5/12/1988 pp. 138-144.
IEEE Spectrum-Neurocomputing Picking the Human Brain by R. Hecht-Nielson 5/88. pp. 36-41.
DARPA Neural Network Study, Oct. 1987-Feb. 1988, MIT Lincoln Laboratory, Appendix A, pp. 35-51.
L. A. Akers et al., "A Limited-Interconnect Synthetic Neural IC", DARPA Neural Network Study, Oct. 1987-Feb. 1988, MIT Lincoln Laboratory, pp. II-15-1-II-152.

Primary Examiner—Stuart N. Hecker
Assistant Examiner—Alyssa H. Bowley
Attorney, Agent, or Firm—Hamilton, Brook, Smith & Reynolds

[57] ABSTRACT

Long and short term memory equations for neural networks are implemented by means of exchange of signals which carry information in the form of both binary and continuously modulated energy emissions. In one embodiment, array of parallel processors exhibits behavior of cooperative-competitive neural networks. Parallel bus interconnections and digital and analog processing of analog information contained in the exchanged energy emissions are employed with generally local synchronization of the processors. Energy emission and detection is modulated as a function of a random code.

7 Claims, 6 Drawing Sheets

NEURAL NETWORK USING RANDOM BINARY CODE

This invention relates to methods of and apparatuses for hardware implementations of neural networks. The invention has particular application in hardware implementations of neural networks describable by sets of first order ordinary differential equations or by sets of finite difference equations with changeable connectivity pattern of the processors and changeable degree of information exchange among the processors.

BACKGROUND

A crucial requirement for a neural network model to be of practical use is its stability. Neural network models whose global stability can be proved are usually described by sets of first order ordinary differential equations of the type $$d/dt\, F_P(t) = G\left(F_R(t); \sum_Q T_{RQ} D_{RQ}(T) s'(F_Q(t))\right)$$

$$d/dt\, D_{PQ}(t) = H(F_R(t); D_{RS}(t))$$

where $F_P(t)$ and $D_{PQ}(t)$ are the short and the long term memory traces, respectively. Function $G(y;z)$ is generally linear in the second argument; the summation is over the processors Q which are the nearest neighbors of processor P; $T_{PQ}$ typically are fixed coefficients taking both positive and negative values, and function $s'(F_P)$ is generally of sigmoid type, i.e., it has a threshold, it is monotonic, and it is bounded. Function H is typically some implementation of Hebbian learning rule.

Such equations were employed for a number of methods for pattern recognition, for construction of content addressable memory, and for determining good solutions of complex optimization problems.

Usually the hardware implementations of the neural network theories consist of digital, or software simulations of the neural network differential equations. Such techniques are time-intensive when used on serial digital computers and, therefore, are slow and expensive. For high speed information exchange among the processors it is advantageous to use parallel interconnections and analog processes to carry the information.

Various attempts have been made to produce analog neural network hardware. One method involves dynamical holograms for redirection of optical signal emitted by coherent sources of the processors. The obvious disadvantage of this method is the difficulty in manufacturing the required integrated optoelectronics and in creation of high quality dynamical hologram while maintaining the information about the processors' interconnections stored in it. Another means to achieve hardware implementation, known in the art, involves manufacture of networks of resistors on a chip. Disadvantages of this method are that the connectivity patterns are constant and once set are impossible to change. In addition, interconnections among the processors take much space on the chip. Finally, because of the general fanout limitations in digital electronics, the fanout for fixed resistor networks can not be expected to be much larger than 100. For comparison the human brain fanout reaches 100,000.

Therefore, there exists a need for simple, cost effective, and energy efficient means for analog, parallel implementation of neural networks with changeable interconnection pattern and large fanout.

DISCLOSURE OF THE INVENTION

The implementation of any neural network model describable by first order differential equations or their finite difference equivalents is performed by arrangement of linear arrays of processors into two or higher dimensional arrays. Each processor of a linear array emits and absorbs energy emissions from one or more common pipeline buses. In one embodiment of the present invention the energy emissions consist of particles of half integer spin, such as electrons, and the corresponding pipelines are strips of conductive material. In some embodiments of the present invention, the conductive material has finite resistivity, in others the resistivity is zero and the conductive material is superconductive. In some embodiments of the present invention, the energy emissions are in the form of radiant energy and consist of particles of integer spin, such as photons, and corresponding pipelines are common radiant energy waveguides.

The linear arrays which are adjacent within the two or higher dimensional array may share one or more of the pipelines. In one embodiment of the present invention each linear array is connected to two or less pipeline buses, in others there are more than two pipeline buses per linear array. In one embodiment of the present invention with two pipeline buses, each pipeline bus is shared by two or less linear arrays, where one of said linear arrays can only emit energy emissions into said pipeline bus and the other of the two said linear arrays can only absorb energy emissions from the pipeline bus to form a feedforward neural network. In others, both linear arrays can emit and absorb the energy emissions from the same pipeline bus to form a feedback neural network.

Each processor of the linear array comprises one or more of the following: input gate, output gate, random code generator, delay/memory circuit, integrator, adder, analog processor.

Each processor is generally locally synchronized with a global base frequency f.

The input and the output gates are controlled by the random code generator which opens or closes them to the respective bus pipelines according to a random binary code at integer multiples of the inverse of the base frequency. When the input gate is open it admits energy emissions from the input bus pipeline. When the output gate is open energy emissions of predetermined amplitude enter the output pipeline bus. When the gates are closed both emission and absorption of the energy emissions do not occur.

The delay/memory circuit controls the timing and the length of the periodic activation of the random code generator within certain period of time $T_p/f$, where $T_p$ is the integer number of pulses of time duration $1/f$, called the pulse length. In one embodiment of the present invention the timing $t_d$, called delay time, and the length of activation, called the code length, are stored within the delay/memory circuit as two integer numbers of pulses each of time duration $1/f$ signifying the timing when the random code generator is turned on, and the duration of its activation. In other embodiments the timing and the length of activation are supplied externally.

During its activation, the random code generator generates a random binary code which controls opening and closing of the gates. The total number of nonzero values of the code is controlled by the processor's external input from pipeline bus and by the average value of the generated code function.

In this particular embodiment of the present invention, the integrators convert piece-wise continuous functions corresponding to the binary codes into continuous functions by averaging the code functions over the time equal to pulse length $T_p/f$. In others, the averaging is over the time interval equal to the code length $T_c/f$.

Analog processors apply non-linear processing to their inputs which are continuous functions supplied by the integrators.

Adders perform linear and non-linear analog summations of their inputs.

Smallness of said processors and low power consumption provide for capabilitY for advantageously large number of processors to be linked in the dYnamically determined interactive neural network, creating a massively parallel data processing device. The use of common bus pipelines provides for an advantageously high fanout per processor.

In certain embodiments of the present invention, .the apparatus is incorporated into an automated pattern recognition device, called Data Recognition Device, where it is used for extraction of features of patterns from data flows to which said Data Recognition Device is subjected. In other embodiments it is incorporated into said Data Recognition Device as a content addressable memory for storage and retrieval of the detected pattern features Various other features of the method and the apparatus of the present invention will become obvious to those skilled in the art upon reading the disclosure set forth hereinafter.

BRIEF DESCRIPTION OF THE DRAWINGS.

The foregoing and other objects, features and advantages of the invention will be apparent from the following more particular description of a preferred embodiment of the invention, as illustrated in the accompanying drawings in which like reference characters refer to the same parts throughout the different views. The drawings are not necessarily to scale, emphasis instead is placed upon illustrating the principles of the invention.

PREFERRED MODE OF THE INVENTION

Figure 1:
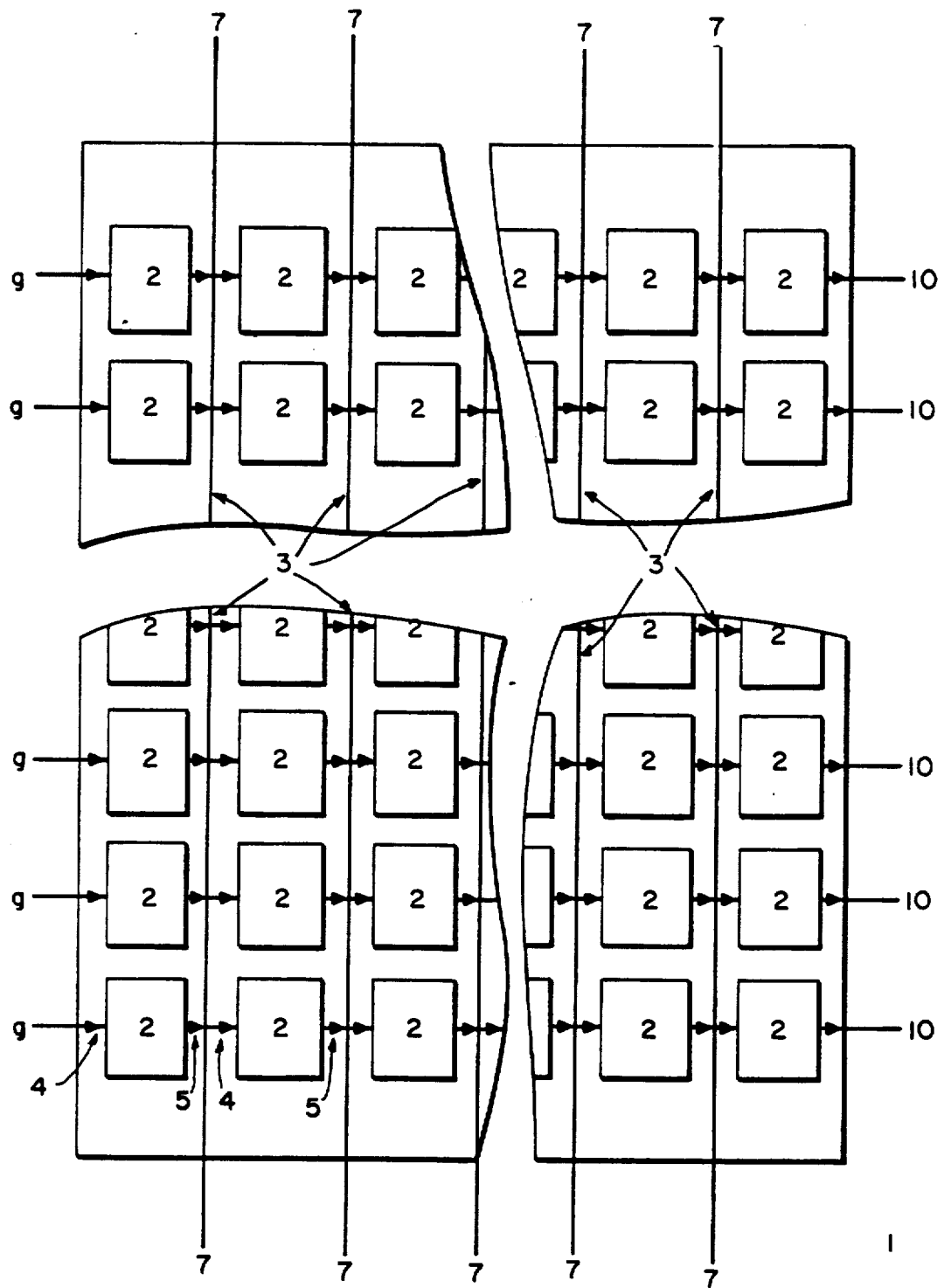
FIG. 1 is an illustration of the bus interconnection structure of a two-dimensional arraY of processors.

Referring now to FIG. 1 one example of the embodiment of the present invention is shown as a linear array 1 of the processors 2 on a single chip. In this embodiment of the present invention, each processor 2 is connected to one bus pipeline 3 with connector 4 for absorption and to the second pipeline bus 3 with connector 5 for emission of the energy emissions from said pipeline bus to form a feedforward neural network. In other embodiments connectors 4 and 5 are connecting said processor to both of said pipeline buses to form a feedback neural network. Connections 7 provide for external control access, for sampling pipeline bus signals, and for connection to additional processor assembly chips. Connections 9 are for the input signals, and connections. 10 are for output signals.

Figure 2:
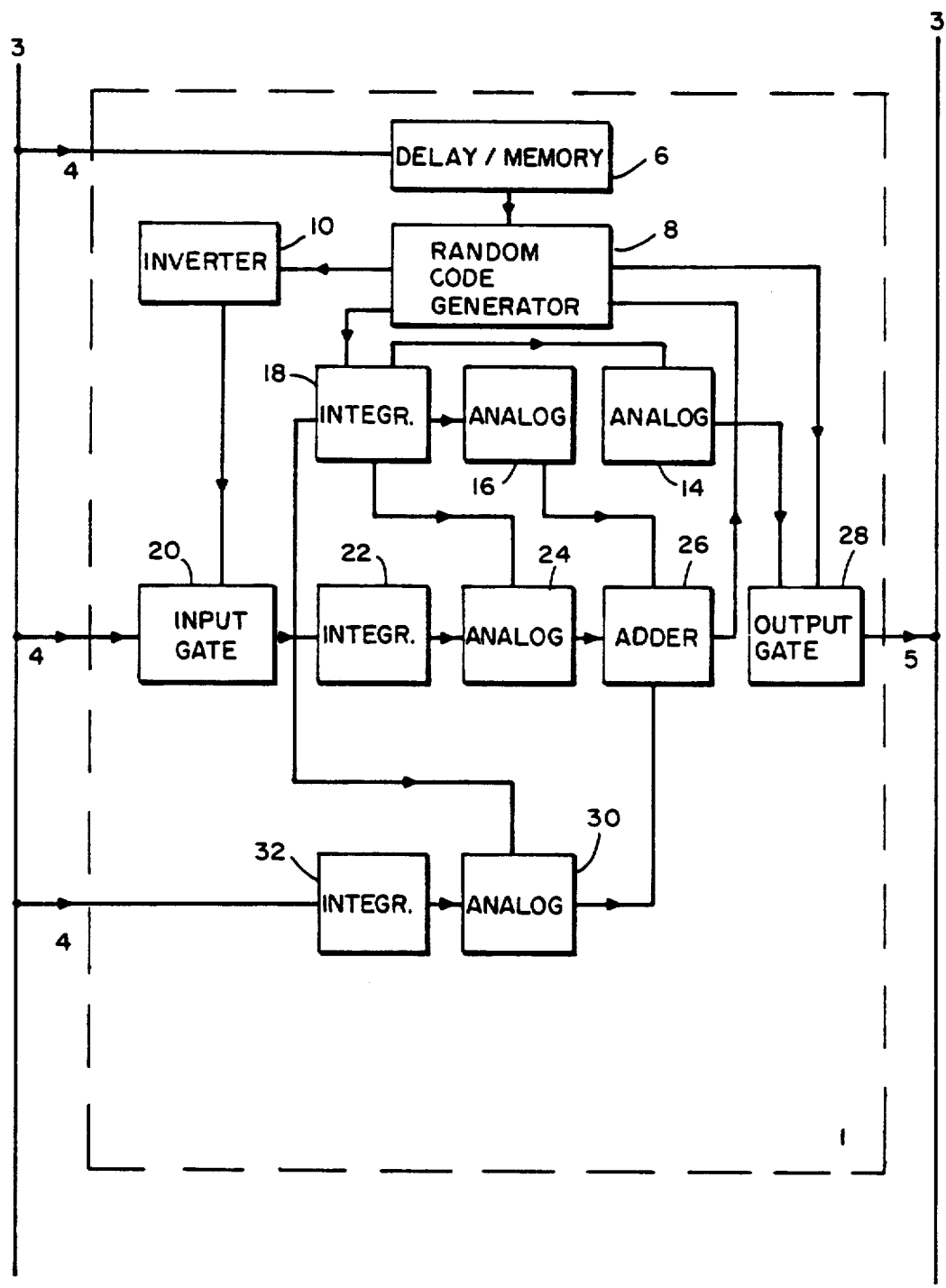
FIG. 2 is a block-diagram of a single processor with arrowed lines depicting flow of control signals.

Referring now to FIG. 2 a block diagram of a single processor 2 is shown. Base clock frequency f is supplied to the delay/memory circuit 6 through connections 7 as shown on FIG. 3. The first few pulses, up to a hundred in number, are reserved for a binary address of the processor among the processors belonging to the same linear array. Said delay/memory circuit with a period equal to pulse length periodically activates the random code generator 8 for a time duration $T_c$, called code length. In the present embodiment of this invention the code lengths of different processors 2 of the array 1 are the same, in others they vary from processor to processor. Said activation occurs with a delay $t_d$ which is an integer multiple of $1/f$. The integer numbers corresponding to the duration of said activation $T_c$ and said delay $t_d$ are stored internally in the delay/memory circle. For a code length $T_c=10,000$ and delay range of variation equal to 10,000, the amount of the required memory is approximately 14 bits, which is advantageously low. In other embodiments of the present invention the timing of the delay and the duration of the activation are controlled externally through access connections 7 by assigning a different address to each processor in a given linear array. For 10,000 processors per linear array the address requires advantageously low number of 14 bits.

During the period of its activation $T_c/f$ random code generator 8 generates a binary random code by advantageously utilizing the noise present in the system. For each processor P this binary code may be described as a piecewise constant function of time $D_P(t)$, whose discontinuities occur only at integer multiples of $1/f$. When $D_P(t)=0$, the corresponding gate is closed when $D_P(t)=1$, the corresponding gate is open. The average value of the code P determines its short term memory trace by the formulas $$F_P(t) = <D_P(t)>$$

$$<D_P(t)> = (1/T_p) \int_{t-T_p}^{t} dt' \, D_P(t')$$

For any two processors P and Q the corresponding long term memory trace is defined as the ratio of the second correlation of the two codes to the product of the averages of the respective codes $$D_{PQ}(t) = <D_P(t) \, D_Q(t)>/F_P(t) \, F_Q(t)$$

Random code generator 8 comprises a memory cell, which holds the integer number equal to the number of positive pulses within the code length $T_c$ of its code function $D_P(t)$. The code function generated by the random number generator 8 is updated in real time pulse by pulse according to the formula $$F_P(t) = F_P(T-T) +$$

$$<(\text{sign } G_P(t-T) \text{ with probability}$$
$$G_P(t-T)S_P(t-T))>$$

where $G_P(t)$ is a function of the external input and $F_P(t)$, sign $G_P(t)$ is the sign of the function $G_P(t)$. Function $S_P(t)$ is determined by $$S_P(t) = \begin{cases} F_P(t) & G_P < 0 \\ 0 & G_P = 0 \\ (1 - F_P(t)) & G_P > 0 \end{cases}$$

In this particular embodiment of the present invention said updating corresponds to the pulse by pulse updating generated by the following algebra $$0+(-1)=0$$
$$0+(+1)=1$$
$$1+(-1)=0$$
$$1+(+1)=1$$

where (0,1) represent code function $D_P(t)$ values and $(-1,+1)$ represent the sign of the update function $G_P(t)$. In other embodiments other choices of the sixteen possible local algebras are used. In yet others, non-local updating algebras are used.

Randomness of the codes ensures that for large samples when $t_d=0$, $T_c=T_p$, for any two processors P and Q $$<D_P(t) D_Q(t)> = <D_P(t)><D_Q(t)>$$

For large codes said updating results in the following short and long term memory equations $$d/dt \, F_P(t) = <G_P(t)S_P(t)>$$

$$d/dt \, D_{PQ}(t) = 0$$

$$D_{PQ}(t) = T_p(t_d^P - t_d^R + T_c)/T_c^2$$

where without loss of generality the delay time $t_d^P$ of processor P is larger or equal to the delay time $t_d^Q$ of processor Q.

The random binary code $D_{PQ}(t)$ generated by random code generator 8 controls opening and closing of input gate 20 and output gate 28.

The controlling signal from random code generator 8 to input gate 20 may be subjected to operation of inversion by inverter 10, which replaces zeros of a code with ones and all ones with zeros.

Figure 4:
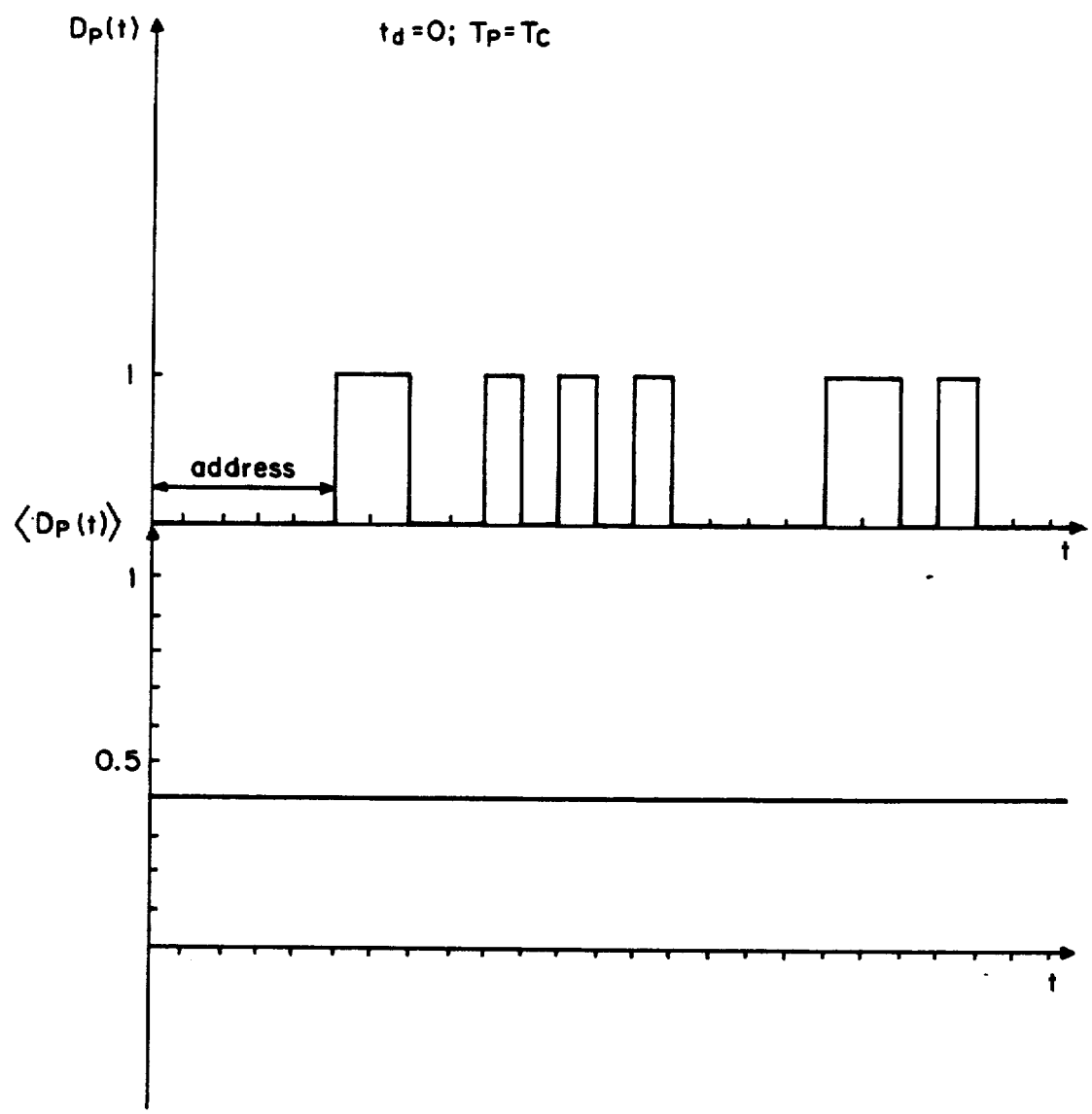
FIG. 4 illustrates averaging of a code by an integrator.

The controlling signal from random code generator 8 to output gate 28 is separated into two signals, one of which undergoes integration by integrator 18, as shown in FIG. 4, and subsequently undergoes analog processing by analog processor 14, as shown on FIG. 5. The output signal $E_{18}$ of integrator 18 has the form $$E_{18}(t) = F_P(t)$$

Figure 5:
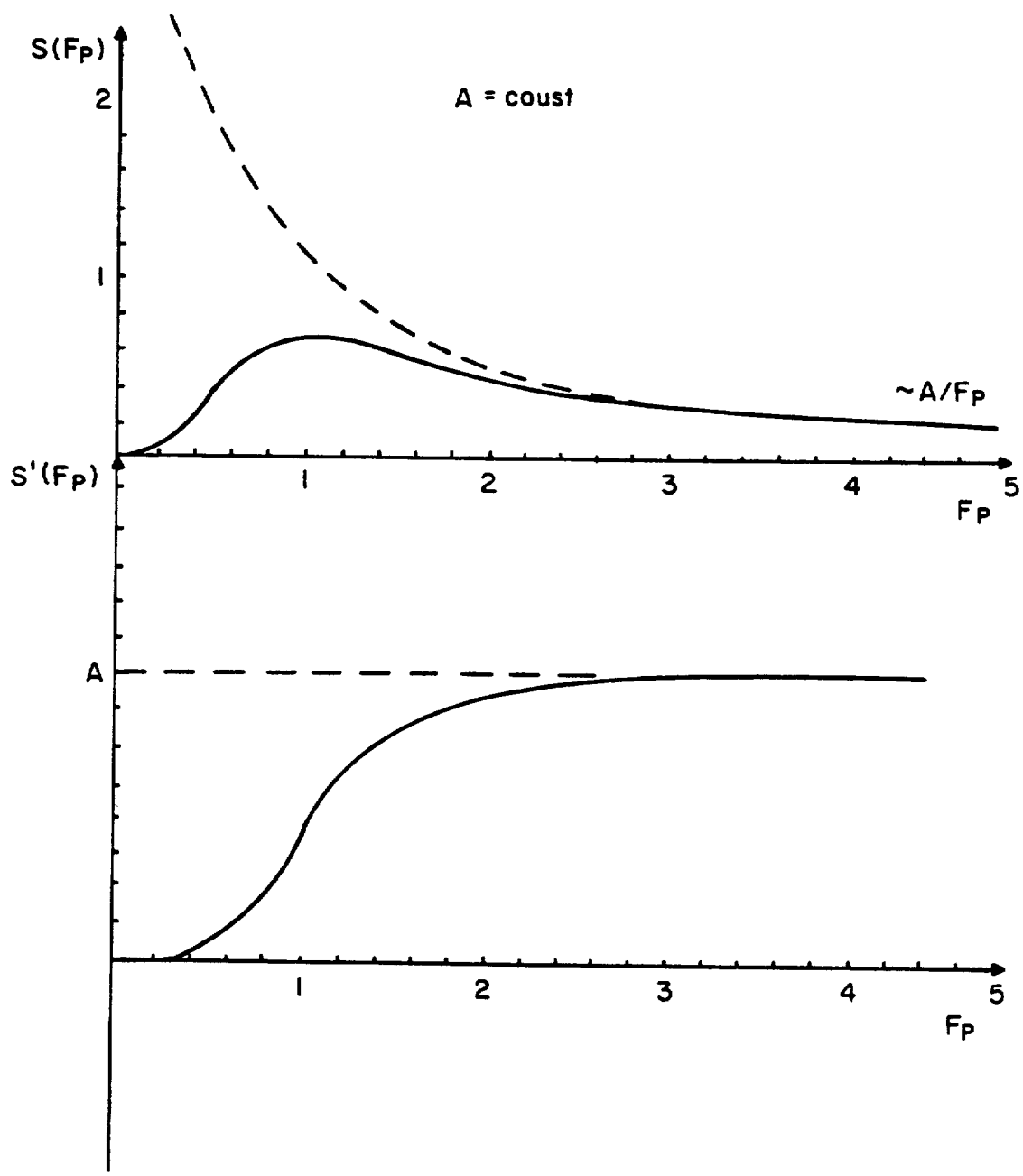
FIG. 5 illustrates non-linear processing by an analog processor.
Figure 6:
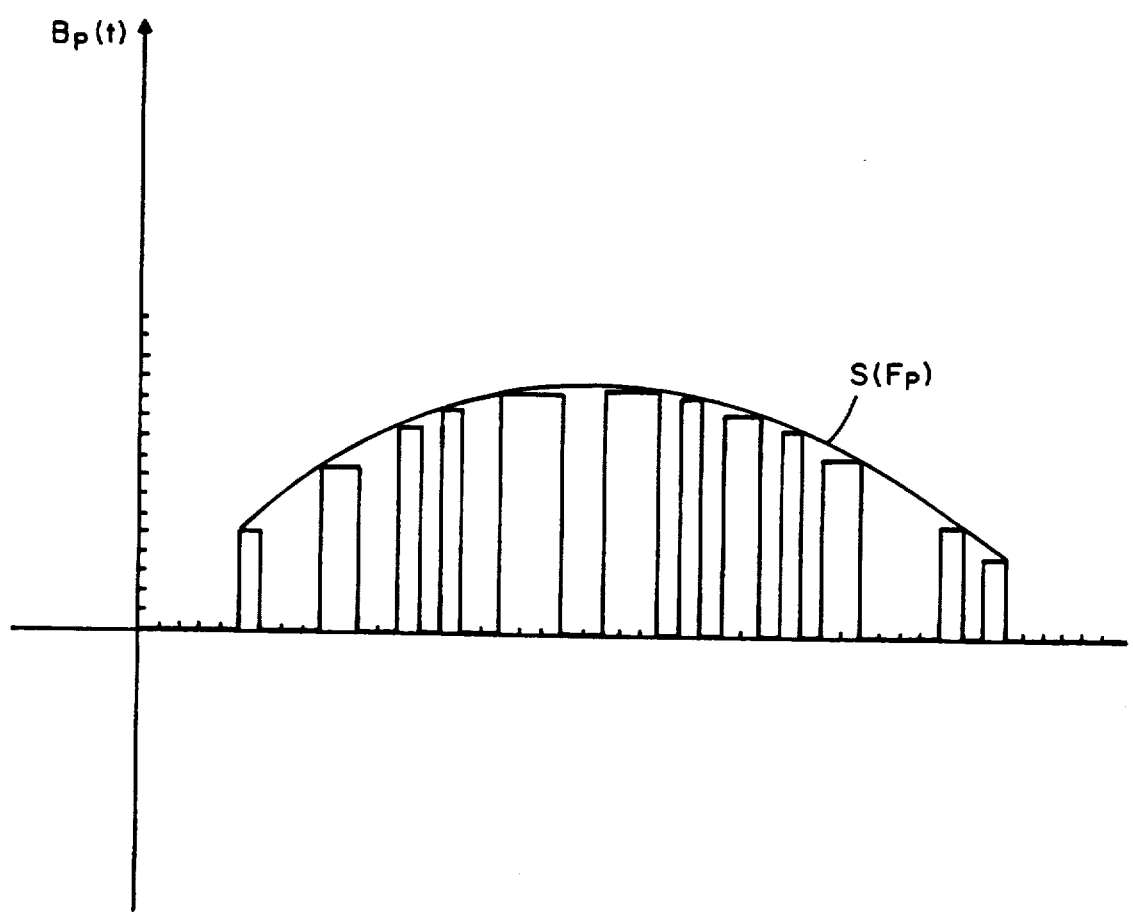
FIG. 6 illustrates a typical energy emission by a processor.

Output gate 28 comprises a source of energy emissions and a modulator. In this embodiment the energy emissions of the source are composed of electrons, in others they are composed of photons. When the code function $D_P(t)$ is zero the source does not emit; during the time when said code function is equal to one, source emits energy with amplitude $B_P(t)$ determined by the output signal of analog processor 14 according to the formula $$B_P(t) = s(F_P(t))$$

where the general form of function $s(F_P)$ is shown on FIG. 5. FIG. 6 shows a typical time dependence of the emitted signal.

The binary signal generated by random code generator 8 and processed by integrator 18 is sent to analog processor 16. Integrator 18 and analog processor 16, in their purpose are identical to integrators 22, 32 and analog processors 14, 24, 30. The output signal of analog processor 16 has the form $$E_{16}(t) = h(F_P(t))$$

where $h(F_P)$ is some advantageously chosen function.

The input signal from pipeline bus 3 is separated into two signals, one of which goes to integrator 32 and analog processor 30. Second controlling signal arrives to analog processor 30 from integrator 18. The input signals to the gate 20 and integrator 32 have the form $$E(t) = \sum_Q T_{PQ} D_Q(t) s(F_Q(t))$$

The output signal of analog processor 30 has the form $$E_{30}(t) = g(F_P(t)) < \sum_Q T_{PQ} D_Q(t) s(F_Q(t)) >$$

where $g(F_P)$ is some advantageously chosen function.

Figure 3:
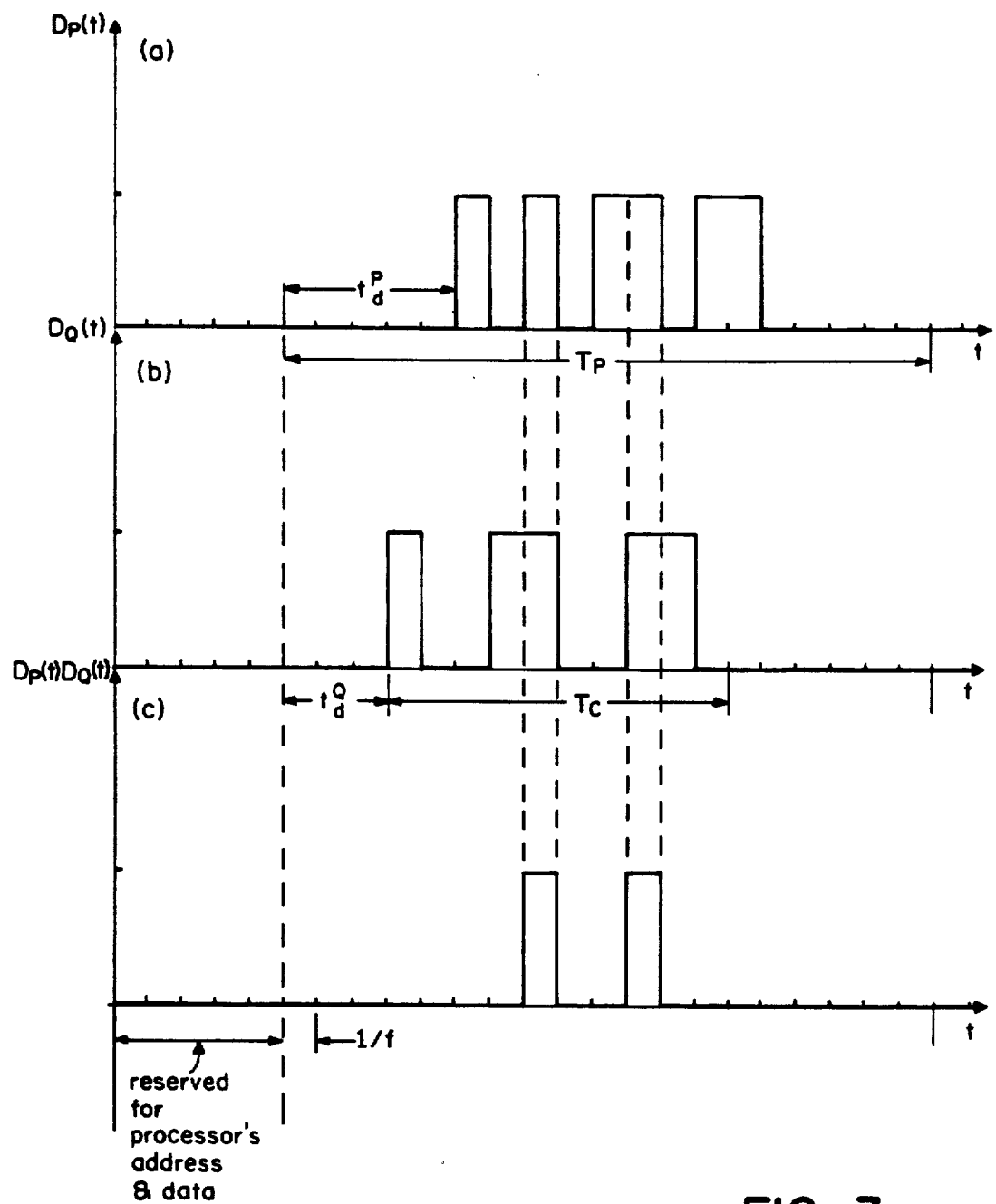
FIG. 3 illustrates two sample random codes and their second correlation.

The second of said two signals passes through gate 20. Referring now to FIG. 3, for a code function $D_P(t)$ given by graph 3(a) and for the pipeline bus input signal given by graph 3(b), the output signal of the gate 20 is given by the graph 3(c) or by the formula $$E_{20}(t) = \sum_Q T_{PQ} D_P(t) D_Q(t) s(F_Q(t))$$

The output signal from the gate 20 is averaged by integrator 22 and further processed by analog processor 24. Analog processor 24 receives the second controlling signal from integrator 18. The output signal of the processor 24 is given by the formula $$E_{24}(t) = f(F_P(t)) < E_{20}(t) >$$

where $f(F_{hd} P(t))$ is some advantageously chosen function.

The signals from analog processors 24, 30 are linearly combined in adder 26, and are non-linearly modulated by the output from the integrator 18. The output signal of adder 26 has the following form $$G_P(t) = h(F_P(t)) + g(F_P(t)) \sum_Q T_{PQ} <D_Q(t)s(F_Q(t))> -$$

$$f(F_P(t)) \sum_Q <T_{PQ} D_P(t) D_Q(t) s(F_Q(t))>$$

The output signal of adder 26 controls updating of the code generated by the random code generator 8 by controlling the total number of positive pulses generated for the new code. The average of the binary code output of the random code generator 8 is given according to the formula $$F_P(t) = F_P(t-T) + \langle sign\ G_P(t-T)\ \text{with probability}\ G_P(t-T)\ S_P(t-T) \rangle$$

When the code length $T_c$ and the pulse length $T_p$ are large we can use the formula $$\langle D_P(t) D_Q(t) \rangle = \langle D_P(t) \rangle \langle D_Q(t) \rangle D_{PQ}$$
$$= F_P(t) F_Q(t) D_{PQ}$$
$$D_{PQ}(t) = T_p(t_d^P - t_d^Q + T_c)/T_c^2$$

and for any two processors the output of the random code generator 8 is updated by the formula $$F_P(t+T) = F_P(t) + h(F_P(t)) + (\text{external input}) + \sum_Q T_{PQ}(1 - D_{PQ}) s'(F_P(t)) s'(F_Q(t))$$

where we chose $g(F_P) = s'(F_P)$, $f(F_P) = s'(F_P)/F_P$ and substituted $s'(F_Q)$ instead of $F_Q s(F_Q)$ according to our choice of function $s(F_Q)$.

The formula above describes a general cooperative-competitive neural network with constant long term memory traces, which include Hopfield neural networks, where external input denotes the input signals through access interconnections 7.

By varying the timing of the delay in the delay/memory circuit 6 and the duration of activation of random code generator 8 one can advantageously change the long term memory traces $D_{PQ}$. In one embodiment of the present invention changing of the long term memory traces is controlled externally, in others it occurs internally as the result of internal controlling of said delays and code lengths $T_c$.

By making delay time $t_d$ equal to the code pulse $T_p$ one can turn off some of the processors in the assembly and, therefore, change the connectivity pattern among the plurality of the processors of the neural network.

I claim:

1. A method of analog, parallel hardware implementation of neural networks with changeable connectivity pattern and changeable long term memory traces comprising:

arranging a plurality of processors into a two dimensional array comprising:

linear arrays of processors; pipeline buses common to one or more of said linear arrays; means for access of input signals; means for retrieval of output signals; means for access of control signals to each processor;

arranging said processors of said linear arrays to absorb and to emit energy in the form of modulated energy emissions from and into one or more pipeline buses common to at least a part of said linear arrays, binary modulation of energy emissions depending on analog characteristics of absorbed energy;

arranging advantageous delay and duration of activation of a random code generator, said binary modulation being a function of a random output from the random code generator;

using averages of the binary codes of said processors' energy emissions as short term memory traces of a neural network;

using the ratios of second correlations of pairs of codes to the products of their averages as long term memory traces of a neural network.

2. A method as claimed in claim 1 wherein the energy emissions are in the form of half integer spin particles.

3. A method as claimed in claim 1 wherein the energy emissions are in the form of particles of integer spin.

4. A method of implementing a neural network comprising:

interconnecting a plurality of processors to detect and emit energy from and to at least one bus; and during code times modulating the energy detection and emission relative to each processor as a function of a random binary code and controlling the timing of said code times during which the energy is detected and emitted, wherein the timing includes the time delay $t_d$ of a code time $T_c$, during which random binary code is activated, within a pulse time $T_p$ during which a code time may occur.

5. A method as claimed in claim 4 further comprising controlling the duration of the code time for each processor.

6. A method as claimed in claim 4 further comprising externally providing the delay time to each processor by addressing the processor.

7. A method as claimed in claim 4 wherein the average of the random binary code is varied as a function of detected energy.

* * * * *